(12) United States Patent
Venkateshwaran et al.

(10) Patent No.: US 7,106,487 B2
(45) Date of Patent: Sep. 12, 2006

(54) THERMAL TUNING OF A LASER USING DOPED SILICON ETALON

(75) Inventors: Balaki Venkateshwaran, Palo Alto, CA (US); Mark McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 242 days.

(21) Appl. No.: 10/606,637

(22) Filed: Jun. 25, 2003

(65) Prior Publication Data

US 2005/0012984 A1      Jan. 20, 2005

(51) Int. Cl.
*G03F 1/03* (2006.01)

(52) U.S. Cl. .................................. 359/260; 372/20

(58) Field of Classification Search ............... 372/20; 359/260; 356/454
See application file for complete search history.

(56) References Cited

U.S. PATENT DOCUMENTS

| | | | | |
|---|---|---|---|---|
| 5,907,420 A * | 5/1999 | Chraplyvy et al. | ......... | 398/180 |
| 6,356,689 B1 * | 3/2002 | Greywall | ...................... | 385/52 |
| 6,787,894 B1 * | 9/2004 | Jeung et al. | ................ | 257/690 |
| 6,804,278 B1 * | 10/2004 | Daiber et al. | ............ | 372/38.01 |
| 2002/0090011 A1 * | 7/2002 | Pezeshki et al. | .............. | 372/20 |
| 2002/0155619 A1 * | 10/2002 | Kurihara et al. | ............ | 436/172 |
| 2003/0015729 A1 * | 1/2003 | Bosco et al. | ................ | 257/190 |

OTHER PUBLICATIONS

Niemi et al. Tunable Silicon Etalon for Simultaneous Spectral Filtering and Wavelength of a DWDM Transmitter. IEEE Photonics Technology Letters. vol. 13, No. 1. Jan. 2001. pp. 58-60.*
Neustroev et al. Hundred MEV Ion Irradiation Effect of Dopant Depth Profiles in Silicon. Semiconductor Conference, 1998. vol. 2. pp. 641-644.*
Silvast, William T. Laser Fundamentals. 2nd Edition. Cambridge University Press. 2004. p. 478.*

* cited by examiner

*Primary Examiner*—Deandra M. Hughes
(74) *Attorney, Agent, or Firm*—Blakely, Sokoloff, Taylor & Zafman LLP

(57) ABSTRACT

In embodiments of the invention, a wavelength-selective device is doped with n-type or p-type material to make the single-crystal silicon in the active region of the device electrically conductive. An electrically conductive and thermally conductive active region allows an external heater such as a platinum heater strip to be eliminated and current to be applied directly to the single-crystal silicon to thermally tune the laser.

23 Claims, 1 Drawing Sheet

(NOT TO SCALE)

- 202 FABRICATE SINGLE CRYSTAL SILICON
- 204 DOPE SINGLE CRYSTAL SILICON
- 206 GROW AND PATTERN MEMBRANE
- 208 DEPOSIT AND PATTERN TEMPERATURE SENSOR
- 210 ETCH AND BOND ETALON TO SHAPE AS DESIRED (NOT TO SCALE)

THERMAL TUNING OF A LASER USING DOPED SILICON ETALON

BACKGROUND

1. Field

Embodiments of the present invention relate to laser systems and, in particular, to tunable external cavity diode lasers systems.

2. Discussion of Related Art

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal.

The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the unprecedented capacity (i.e., bandwidth) offered by optical fibers. Essentially, each channel has its own wavelength, and all wavelengths are separated enough to prevent overlap. The International Telecommunications Union (ITU) currently determines the channel separations.

One link of an optical telecommunication system typically has a transmitter, the optical fiber, and a receiver. The transmitter has a laser, which converts an electrical signal into the optical signal and launches it into the optical fiber. The optical fiber transports the optical signal to the receiver. The receiver converts the optical signal back into an electrical signal.

External cavity lasers (ECL) are common light sources. While such lasers have typically operated at a single wavelength or channel, tunable lasers have been recently developed that can address many channels, for example, at least all channels in one of the communication frequency bands specified by the ITU.

A typical tunable external cavity laser includes a laser diode that emits a light beam. A lens collimates the light beam and focuses it onto an (one or more) etalon. The etalon is a wavelength selective element that selects a particular wavelength from the light beam and passes only that wavelength. The tunable external cavity laser includes an end mirror. The light beam with the selected wavelength is incident on the end mirror and reflects back into the cavity, providing optical feedback that is essential for the functioning of an external cavity laser.

The laser diode has a front facet coated with an anti-reflective (AR) material that minimizes optical loss of the light coupled to the lens. The laser diode has a back facet coated with a highly reflective material. The end mirror of the external cavity and the reflective back facet of the laser diode form a cavity in which light at the selected wavelength is reflected back and forth. The light is amplified in the process and a light beam at the selected wavelength is output by the tunable external cavity laser. This is sometimes called the operating wavelength.

One of the simplest ways to change the operating wavelength is by thermal tuning. One known thermally tuned etalon has a platinum heater strip coupled to the surface of the active region of the etalon. The platinum strip heats up when current is applied and the heat is dissipated throughout the etalon. When the etalon is heated, its wavelength selectivity characteristics change and it passes a different wavelength. When the wavelength that the etalon passes changes the laser operating wavelength changes.

One problem with this known thermally tuned etalon design is that the platinum heater strip tends to degrade at high temperature and/or high current densities. The degradation accelerates each time there is a change in temperature of the platinum strip to accommodate changing of the operating wavelength of the laser. Degradation of the platinum heater strip results in poor control of the operating wavelength. If the platinum heater strip ultimately degrades to the point at which it eventually fails, the ability to control the operating wavelength of the laser is lost. Platinum heater strip degradation can therefore present a reliability issue and thus become a limiting factor in designing and operating this type of known thermally tuned laser.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
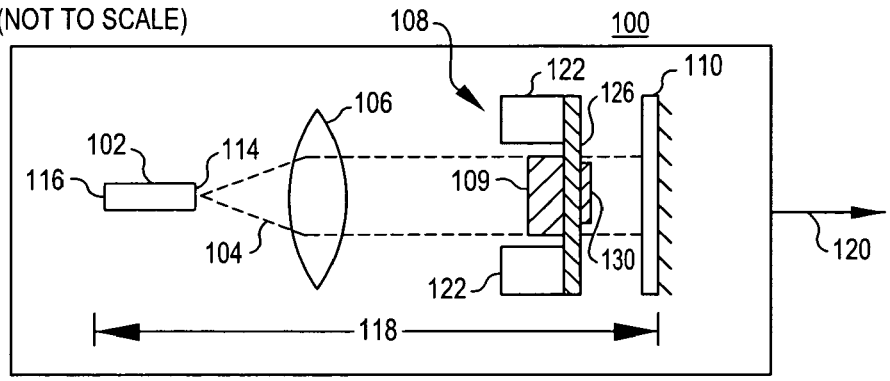
FIG. 1 is a schematic diagram of a tunable external cavity laser (ECL) according to embodiments of the present invention.

FIG. 1 shows a typical tunable external cavity laser 100 according to an embodiment of the present invention, which includes a laser diode 102 that emits a light beam 104. The light beam 104 includes several wavelengths. A lens 106 collimates the light beam 104 and causes the entire beam to reach a (one or more) wavelength (or frequency)-selective element (e.g., an etalon) 108. The etalon 108 selects a particular wavelength from the light beam 104 and passes only that wavelength.

The tunable external cavity laser 100 includes an end mirror 110. The light beam 104 with the selected wavelength is incident on the mirror 110. The laser diode 102 has a front facet 114 coated with an anti-reflective (AR) material that allows the light beam 104 to be optically coupled into and out of the laser diode 102 to the lens 106 and prevents loss of light energy due to stray reflections. The laser diode 102 has a back facet 116 coated with a highly reflective material that causes the light beam 104 to be reflected back into the laser diode 102.

The end mirror 110 and the reflective back facet 116 form a cavity 118 in which the light beam 104 at the selected wavelength is reflected back and forth. The light beam 104 is amplified in the process and a light beam 120 at the operating wavelength is output by the tunable external cavity laser 100.

As discussed above, active regions of the thermally tuned etalons are thermally conductive. However, they are not electrically conductive because they are made from intrinsic single-crystal silicon, which is silicon of extremely high purity whose atoms are arranged in the same pattern throughout the silicon. Intrinsic silicon is a poor conductor of electricity, which is why a separate current driven heater element is used to heat known etalons for laser tuning.

According to embodiments of the present invention, the example etalon 108 does not have a heater element like the platinum heater strip of known etalons because in embodiments of the present invention the single-crystal silicon in the active region 109 has been rendered electrically conductive. As a result, the platinum heater elements can be eliminated and a current can be applied directly to the active region 109 to thermally tune the external cavity laser 100.

To thermally tune the tunable external cavity laser 100, current may be applied to the active region 109. When current is applied to the active region 109, the single-crystal silicon (shown in FIG. 3 below) in the active region 109 conducts current. When the single-crystal silicon in the active region 109 conducts current, the single-crystal silicon heats up. When the single-crystal silicon in the active region 109 heats up the heat is dissipated throughout the active region 109. When the active region 109 is heated, the wavelength-selectivity characteristics of the etalon 108 change and the etalon 108 passes a different wavelength. When the wavelength that the etalon 108 passes changes the tunable external cavity laser 100 operating wavelength changes.

There are at least four advantages to having an electrically conductive active region 109. First, the platinum heater traces can be eliminated, resulting in fewer components in the etalon 108. As a general rule, fewer individual components in a device increase device reliability and manufacturing yield.

Second, the stage in the known etalon fabrication process used to create the platinum heater strip elements on the single-crystal silicon is eliminated. Also, as a general rule in fabrication of components, the fewer stages in the fabrication process the better.

Third, the heat released in the etalon 108 is rapidly and homogenously distributed through the body of the etalon 108 than if the platinum heater traces were used. This may result in lower power consumption, more uniform heating in the etalon 108, and possibly increased wavelength tuning speed of the tunable laser.

Fourth, a condensed fabrication process not only improves device reliability and yield, but also reduces overall cost of the device.

The example etalon 108 also has an inactive region 122 and a membrane 126. The membrane 126 mechanically couples the active region 109 and the inactive region 122 to each other.

In embodiments of the present invention, the inactive region 122 may be made from bulk silicon. In general, bulk silicon is silicon with large enough dimensions so that quantum size effects are negligible.

The membrane 126 may be any material such as silicon oxide ($SiO_2$), silicon nitride (SiN), or other suitable thin film with low electrical and thermal conductivity that can be formed or deposited on silicon. The silicon oxide (SiO2) may have varying atomic ratios of silicon and oxygen. The silicon nitride (SiN) may have varying atomic ratios of silicon and nitrogen.

In one embodiment, the etalon 108 also includes a temperature sensor 130. Temperature sensor may be a platinum (Pt) temperature sensor. When a current is applied to the temperature sensor 130, the temperature sensor 130 senses the temperature of the single-crystal silicon in the active region 109.

Figure 2:
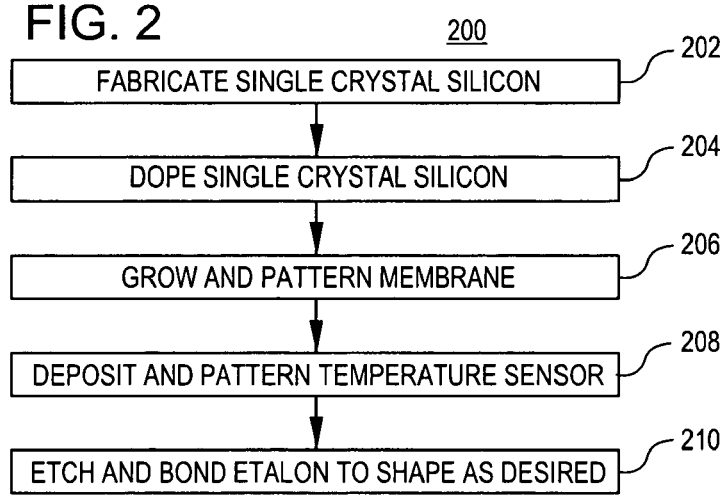
FIG. 2 is a simplified flowchart illustrating an approach to fabricating a thermally tunable etalon according to an embodiment of the present invention.

FIG. 2 is a flowchart illustrating a process 200 for fabricating an etalon, such as the etalon 108, according to embodiments of the present invention. A machine-accessible medium with machine-accessible instructions thereon may be used to cause a processor to perform the process 200 or portions thereof. Of course, the process 200 is only an example process and other processes may be used.

In a block 202, single crystal silicon of the active region 109 is fabricated using known techniques. In one embodiment, single-crystal silicon is grown using known chemical vapor deposition (CVD), epitaxial techniques, or other widely available bulk single-crystal silicon growth techniques.

In block 204, the single-crystal silicon is doped. Doping can be achieved using known methods of in-situ doping, diffusion or ion implantation.

For example, in ion implantation, the single-crystal silicon may be bombarded with high-energy dopant ions. The ion-bombarded single-crystal silicon may be thermally treated to activate the dopant ions. Thermal treatment may be by known furnace annealing methods or known rapid temperature annealing (RTA) methods.

In an alternative embodiment, the single-crystal silicon may be doped using diffusion. For example, a reasonably thick layer of dopant may be blanket deposited on the single-crystal silicon.

The single-crystal silicon and dopant are then thermally treated to diffuse and activate the dopant ions into the single-crystal silicon. Thermal treatment may be by known furnace annealing methods. Alternatively, thermal treatment may be by known rapid temperature annealing (RTA) methods. The thickness of the blanket dopant film, temperature, and the duration of the thermal treatment determine the amount of diffusion of the dopant into the single-crystal silicon.

In yet another embodiment, the single crystal silicon can be doped in-situ in that dopants are introduced at the same time that the single crystal silicon is grown or deposited using known methods.

The dopant species may be n-type material or p-type material. The material type determines the direction that current will flow in the single-crystal silicon.

In one embodiment, the dopant species may be boron (B). In an alternative embodiment, the dopant species may be phosphorous (P). In still other embodiments of the present invention, dopant species may be arsenic (As), or other suitable III-V dopant.

The dopant concentration determines the electrical conductivity of the single-crystal silicon in the active region 109. In one embodiment, the single-crystal silicon in the active region 109 may be bombarded with approximately fifty kilo electron volts (KeV) of dopant species having a concentration in the range of approximately $10^{-14}$ to $10^{-16}$ ions per cubic centimeter. In this example embodiment, the conductivity of the single-crystal silicon may be approximately thirty seven hundred micro mhos.

Of course, other conductivities, dopant species, and dopant concentrations are possible After reading the description herein a person of ordinary skill will readily recognize how to implement various embodiments of the present invention using other dopant species and dopant concentrations to arrive at other conductivities.

In a block 206, the membrane 126 is grown and patterned on top of the inactive region 122 and the active region 109.

In one embodiment, nitrogen (N), oxygen ($O_2$), or other suitable materials are used in conjunction with known low pressure chemical vapor deposition (LPCVD) or using known plasma enhanced chemical vapor deposition (PECVD) techniques to form a membrane layer of a desired thickness over the inactive region and the active region 109. The materials react and a layer of silicon oxide ($SiO_2$), silicon nitride (SiN), or other suitable thin film is formed.

Undesired areas of bulk or single crystal silicon material may be removed using known techniques. Etching also may be performed to maintain the appropriate geometry for the etalon 108.

In a block 208, the temperature sensor 130 is deposited and patterned on the surface of the membrane 126. In one embodiment, a platinum sensor strip may be deposited using known sputtering techniques. Alternatively, a platinum sensor strip may be deposited using known evaporation techniques. In yet another embodiment, one or more bond pads may be mounted on both the top and bottom facets of the etalon. In yet another embodiment, one or more bond pads may be mounted on both the top and bottom facets of the etalon.

In a block 210, the etalon 108 is etched and bonded to shape it as desired using known shaping and bonding techniques. In one embodiment, the thickness of the inactive region 122 may be increased using wafer bonding and/or etching techniques. Alternatively, the thickness of the inactive region 122 may be increased using LPCVD or PECVD techniques.

Figure 3:
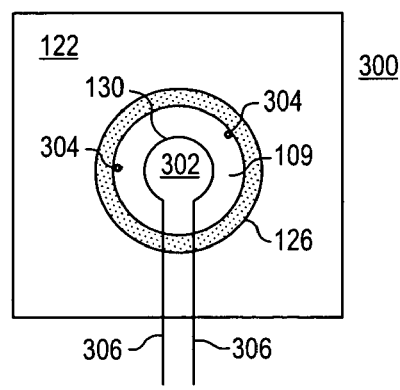
FIG. 3 is a schematic diagram (top view) of a thermally tunable etalon according to an embodiment of the present invention.

FIG. 3 is a schematic diagram of an example etalon 300 fabricated according to an alternative embodiment of the present invention. The example etalon 300 includes the inactive region 122, the membrane 126, and the active region 109. The active region 109 includes the temperature sensor 130 and doped single-crystal silicon 302.

In one embodiment, the doped single-crystal silicon 302 may have one or more bond pads 304 mounted thereon. In an alternative embodiment, the bond pads 304 are mounted along the perimeter of the doped single-crystal silicon 302. The temperature sensor 130 has one or more electrical leads 306 attached thereto. In still another embodiment, one or more bond pads 304 may be mounted on both the top and bottom facets of the etalon 300. The bond pads 304 may be gold bond pads or other suitable bond pads.

The temperature sensor 130 may have one or more electrical leads 306 attached thereto. To thermally tune the external cavity laser 100, current may be applied to the doped single-crystal silicon 302 via the bond pads 304

In embodiments of the present invention, the area of the example etalon 300 may be 2500 microns by 2500 microns (or 625 $cm^2$), the membrane 126 thickness may range from 0.1 to 1 microns, the bulk silicon 122 may be up to approximately five hundred microns thick, and/or the doped single-crystal silicon 302 may be may be between one hundred and three hundred microns thick. Of course the dimensions listed above are example dimensions and etalons of varying dimensions can be fabricated for specific applications according to embodiments of the present invention.

Figure 4:
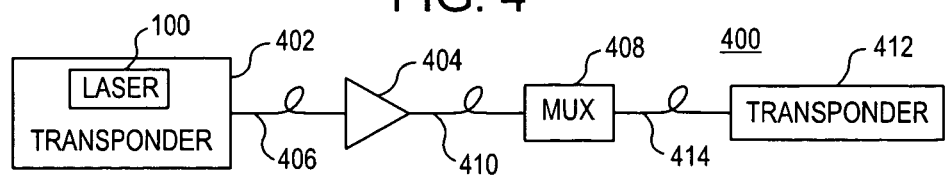
FIG. 4 is a high-level block diagram of an optical system according to an embodiment of the present invention.

FIG. 4 is a high-level block diagram of a communication system 400 according to an embodiment of the present invention. The system 400 includes a transponder 402 coupled to an optical amplifier 404 via an optical fiber 406. The optical amplifier 404 is coupled to a multiplexer 408 via an optical fiber 410. The multiplexer 408 is coupled to a transponder 412 via an optical fiber 414.

The transponder 402 includes the tunable external cavity laser 100. Although only one transponder 402, optical amplifier 404, optical fibers 406, 410, and 414, multiplexer 408, and transponder 412 are shown, it is common to have numerous transponders, optical amplifiers, optical fibers, and multiplexers in optical communication systems. Single units are shown for simplicity.

The transponder 402 may transmit light beams generated by the tunable external cavity laser 100. The transponder 402 also may receive light beams.

The optical amplifier 406 may be an erbium (Er) doped fiber amplifier (EDFA). Alternatively, the optical amplifier 406 may be a ytterbium (Yb) doped fiber amplifier, a praseodymium (Pr) doped fiber amplifier, a neodymium (Nd) doped fiber amplifier, or other suitable optical amplifier.

The multiplexer 408 may be a DWDM multiplexer. Alternatively, the multiplexer 408 may be an add-drop multiplexer.

Of course, embodiments of the present invention are not limited to communication systems such as the communication system 400. For example, wavelength-selective dispersive elements fabricated according to embodiments of the present invention may be used in spectroscopy systems, metrology systems, sensing systems, biological systems, research and development systems, and/or testing systems.

Although embodiments of the present invention have been described with respect to etalons, embodiments of the present invention may include implementations using other wavelength-selective dispersive elements. After reading the description herein, persons of ordinary skill in the relevant art will readily recognize how to implement embodiments of the present invention for other wavelength-selective dispersive elements.

The above description of illustrated embodiments of the invention is not intended to be exhaustive or to limit embodiments of the invention to the precise forms disclosed. While specific embodiments of, and examples for, the invention are described herein for illustrative purposes, various equivalent modifications are possible, as those skilled in the relevant art will recognize. These modifications can be made in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Various operations have been described as multiple discrete operations performed in turn in a manner that is most helpful in understanding embodiments of the invention. However, the order in which they are described should not be construed to imply that these operations are necessarily order dependent or that the operations be performed in the order in which the operations are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed is:

1. An apparatus, comprising:
   an external cavity laser having a silicon etalon heater, the silicon etalon heater having:
   a single-crystal silicon active region fully or partially transparent to an optical signal;
   a bulk silicon inactive region; and
   a membrane coupling the single-crystal silicon active region to the bulk silicon inactive region,
   the single-crystal silicon active region having a dopant, the single-crystal active region being electrically conductive, the single-crystal active region being thermally tunable, to pass a specific wavelength in response to the received optical signal.

2. The apparatus of claim 1, wherein the single-crystal silicon active region includes a p-type material dopant.

3. The apparatus of claim 2, wherein the single-crystal silicon active region includes a boron (B) dopant.

4. The apparatus of claim 1, wherein the single-crystal silicon active region includes an n-type material dopant.

5. The apparatus of claim 4, wherein the single-crystal silicon active region includes a phosphorous (P) dopant.

6. The apparatus of claim 4, wherein the single-crystal silicon active region includes an arsenic (As) dopant.

7. The apparatus of claim 1, wherein the membrane is a silicon nitride (SiN) membrane, with varying atomic ratios of silicon and nitrogen.

8. The apparatus of claim 1, wherein the membrane is a silicon oxide ($SiO_2$) membrane.

9. The apparatus of claim 1, further comprising a temperature sensor formed on the single-crystal silicon active region.

10. The apparatus of claim 1, further comprising a platinum temperature sensor formed on the single-crystal silicon active region.

11. The apparatus of claim 1, further comprising gold bond pads mounted to the perimeter of the single-crystal silicon active region.

12. The apparatus of claim 1, further comprising bond pads mounted to the top of the single-crystal silicon active region.

13. The apparatus of claim 1, further comprising bond pads mounted to the bottom of the single-crystal silicon active region.

14. A system, comprising:
   a transponder having an external cavity laser, the external cavity laser having a silicon etalon heater, the silicon etalon heater having:
   a silicon etalon heater having a single-crystal silicon active region adapted to receive an optical signal, a bulk silicon inactive region, and a membrane coupling the single-crystal silicon active region to the bulk silicon inactive region, the single-crystal silicon active region being electrically conductive and thermally conductive, the single-crystal silicon active region coupled to receive a current to thermally tune the single-crystal silicon active region to pass a wavelength in response to the received optical signal; and
   an erbium-doped fiber amplifier (EDFA) coupled to the transponder.

15. The system of claim 14, further comprising a multiplexer coupled to the EDFA.

16. The system of claim 15, further comprising an add-drop multiplexer coupled to the EDFA.

17. A method, comprising:
   tuning an external cavity laser using a silicon etalon heater by:
   adjusting resistivity of the silicon etalon heater, the silicon etalon having a membrane coupling a single-crystal silicon active region to a bulk silicon inactive region, wherein adjusting the resistivity comprises doping the active region of the silicon etalon;
   applying a current to the silicon etalon heater; and
   selecting a wavelength in response to an incident optical signal using the current applied to the silicon etalon heater.

18. The method of claim 17, further comprising applying a second current to the doped silicon etalon to thermally tune the doped silicon etalon to select a second wavelength.

19. The method of claim 18, further comprising sensing the temperature of the doped silicon etalon.

20. An apparatus, comprising:
   a laser having:
   a cavity; and
   a doped silicon etalon heater positioned in the cavity, wherein the doped silicon etalon comprises a membrane coupling a single-crystal silicon active region to a bulk silicon inactive region, wherein the single-crystal silicon active region is electrically conductive, and wherein the doped silicon etalon heater is to receive a current to tune the laser.

21. The apparatus of claim 20, wherein the doped silicon etalon includes a p-type material dopant.

22. The apparatus of claim 21, wherein the doped silicon etalon includes a boron (B) dopant.

23. The apparatus of claim 20, wherein the doped silicon etalon includes an n-type material dopant.

* * * * *